(12) United States Patent
Zhou et al.

(10) Patent No.: US 12,176,455 B2
(45) Date of Patent: Dec. 24, 2024

(54) HEATING TREATMENT DEVICE FOR PHOTOVOLTAIC MODULE RECYCLING

(71) Applicant: CHANGZHOU INSTITUTE OF TECHNOLOGY, Changzhou (CN)

(72) Inventors: Pin Zhou, Changzhou (CN); Jingbo Zhao, Changzhou (CN); Xiaohui Chen, Changzhou (CN); Quanfa Zhou, Changzhou (CN); Shubo Wang, Changzhou (CN); Yu Zhao, Changzhou (CN)

(73) Assignee: CHANGZHOU INSTITUTE OF TECHNOLOGY, Changzhou (CN)

( * ) Notice: Subject to any disclaimer, the term of this patent is extended or adjusted under 35 U.S.C. 154(b) by 152 days.

(21) Appl. No.: 18/103,519

(22) Filed: Jan. 31, 2023

(65) Prior Publication Data
US 2024/0079514 A1 Mar. 7, 2024

(30) Foreign Application Priority Data
Sep. 1, 2022 (CN) .......................... 202211065499.5

(51) Int. Cl.
H01L 31/18 (2006.01)
H01L 21/687 (2006.01)

(52) U.S. Cl.
CPC ........ *H01L 31/18* (2013.01); *H01L 21/68728* (2013.01); *H01L 21/6875* (2013.01)

(58) Field of Classification Search
CPC .......... H01L 21/6875; H01L 21/68728; H01L 31/18
USPC ......................................................... 156/752
See application file for complete search history.

(56) References Cited

U.S. PATENT DOCUMENTS

2024/0051002 A1* 2/2024 Zhou ........................ B09B 3/70

* cited by examiner

Primary Examiner — James D Sells
(74) Attorney, Agent, or Firm — Bayramoglu Law Offices LLC

(57) ABSTRACT

A heating treatment device for photovoltaic module recycling includes a box, a heating rod and a gas pump. A horizontal partition is fixedly arranged inside the box, and the heating rod is located below the partition. The partition is provided with evenly distributed second through slots. An upper end of the partition is provided with evenly distributed shelf boards. The shelf boards are arranged vertically. One side of the shelf board is provided with a groove. The shelf board is further provided with a suction cup. An end surface at an opening of the suction cup is flush with an inner wall of the groove. The movable splitting sheets are arranged in the device. A lower end of the splitting sheet is provided with gas vents, and hot air is discharged through the gas vents. The temperature of the hot air is controlled at 220-240° C.

16 Claims, 6 Drawing Sheets

HEATING TREATMENT DEVICE FOR PHOTOVOLTAIC MODULE RECYCLING

CROSS REFERENCE TO THE RELATED APPLICATIONS

This application is based upon and claims priority to Chinese Patent Application No. 202211065499.5, filed on Sep. 1, 2022, the entire contents of which are incorporated herein by reference.

TECHNICAL FIELD

The disclosure relates to the technical field of photovoltaic module recycling, in particular to a heating treatment device for photovoltaic module recycling.

BACKGROUND

With the increasingly prominent problems of energy shortage, environmental pollution and climate change, the energy revolution of replacing traditional energy by clean energy is quietly staged, and solar energy is one of the most promising clean energies. Among the solar electric power generation technologies, photovoltaic power generation has always been dominating the industry. As large-scale centralized and distributed photovoltaic power generation projects are put into operation, the problem of disposal of waste photovoltaic modules will become increasingly prominent. Improper disposal of waste photovoltaic modules not only leads to environmental pollution, but also causes waste of resources.

In the world, the recycling of waste crystalline silicon photovoltaic modules generally includes the following steps: 1) Demounting and transportation: The waste crystalline silicon photovoltaic module is demounted and transported to a recycling organization. 2) Disassembly: The aluminum frame and the junction box are removed from the crystalline silicon photovoltaic module. 3) Separation: The disassembled crystalline silicon photovoltaic module is a laminate composed of front glass, solar cells, a backsheet (or back glass) and EVA. Separating this laminate and sorting out valuable materials is the most critical step in module recycling technology, which involves the recycling effect and profits of the module. 4) Reuse: The sorted materials are sent to corresponding industries for reuse. For example, the glass is recycled and sent to glasswork, the aluminum frame is sent to an aluminum refinery, the waste plastic may be sent to a cement plant as a fuel, the silicon may be sent to a precious metal manufacturer, and the remaining cables and connectors of the junction box are crushed and copper is extracted therefrom and sent to a copper product factory. At present, according to different separation ways for the laminate, the recycling methods of waste crystalline silicon photovoltaic modules can be classified into 3 types: heating treatment, chemical dissolution and physical separation.

The heating treatment is classified into low-temperature heating treatment and high-temperature heating treatment. In the low-temperature heating treatment, based on the fact that EVA is gradually softened by heating, the laminate is heated to soften the EVA therein, so that the front glass, the solar cells and the backsheet (or back glass) in the laminate are separated. At present, the heating equipment used in this low-temperature heating treatment is typically a fluidized bed reactor, and may also be an RF current heating plate or an infrared heater. The low-temperature heating treatment is simple and practical, but sometimes may not be able to remove the EVA thoroughly, leaving a small amount of residues on the surface of the glass and the solar cells. In the high-temperature heating treatment, EVA is removed based on the fact that EVA is gradually decomposed at high temperature. At present, the high-temperature heating treatment is mainly classified into oxygen-absent high-temperature heating treatment and oxygen-present high-temperature heating treatment, both of which have an EVA removal rate of 99% or above.

However, in the high-temperature heating treatment, more energy is consumed, and some harmful gases may be produced. Therefore, the disclosure provides a heating treatment device for photovoltaic module recycling that can effectively remove EVA at a lower temperature.

SUMMARY

An object of the disclosure is to provide a heating treatment device for photovoltaic module recycling so as to overcome the defects in the prior art.

To achieve the above object, the disclosure adopts the following technical solutions:

A heating treatment device for photovoltaic module recycling includes a box, a heating rod and a gas pump. A horizontal partition is fixedly arranged inside the box, and the heating rod is located below the partition. The partition is provided with evenly distributed second through slots. An upper end of the partition is provided with evenly distributed shelf boards. The shelf boards are arranged vertically. One side of the shelf board is provided with a groove. The shelf board is further provided with a suction cup. An end surface at an opening of the suction cup is flush with an inner wall of the groove. The suction cup is connected to an inlet end of a negative pressure pump through a first connecting tube. Silicon wafer separating mechanisms are further arranged inside the box. The silicon wafer separating mechanism is located right above the corresponding second through slot. The silicon wafer separating mechanism includes a fixing rod, and a height of two ends of the fixing rod is less than that of a middle part of the fixing rod. When the two ends of the fixing rod 9 move to below a photovoltaic module, the middle part of the fixing rod 9 is still above the photovoltaic module, that is, when flexible magnetic meshes 14 pass through two ends of the lower end of the photovoltaic module and clamp the silicon wafer, the middle part of the lower end of the silicon wafer is still bonded with a glass sheet. In this way, before the silicon wafer is completely separated from the glass sheet, the flexible magnetic meshes 14 can support the silicon wafer, thereby preventing the silicon wafer from falling off. The middle part of the fixing rod is provided with a first through slot along a length direction thereof. A lower end of the fixing rod is fixedly provided with two splitting sheets corresponding to each other. The splitting sheets are located on two sides of the first through slot. A gas channel is arranged inside the fixing rod. The splitting sheet is provided with evenly distributed gas vents. The gas vents communicate with the gas channel. Openings of the gas vents face downward. The gas channel is connected to an outlet end of the gas pump through a second connecting tube. An inlet end of the gas pump is located below the partition and communicates with the inside of the box. An upper end of the box is further provided with a servo push rod for driving the fixing rod to make a vertical rectilinear motion.

Preferably, an upper end of the fixing rod is connected with two flexible magnetic meshes corresponding to each other, and the flexible magnetic mesh is wound outside a rotary roller. An end of the rotary roller is rotatably connected to the box, and an outer wall of the box is provided with a servo motor for driving the rotary roller to rotate. The servo motor 21 rotates to wind or unwind the flexible magnetic meshes 14.

Preferably, the two ends of the fixing rod are respectively fixedly provided with a fixed block, and a retractable end of the servo push rod is fixedly connected to the fixed block.

Preferably, the upper end of the box is fixedly provided with a fixed tube, and an upper end of the fixed tube is provided with an end cap. The upper end of the fixed tube communicates with the second connecting tube, and a movable tube is inserted into a lower end of the fixed tube. An outer wall of the movable tube is hermetically connected to an inner wall of the fixed tube. A lower end of the movable tube is fixedly connected to the fixed block, and the movable tube communicates with the gas channel. When the servo push rod 7 pushes the fixing rod 9 to move, the movable tube 11 can move along the fixed tube 10, and gas in the fixed tube 10 can normally flow to the movable tube 11. The movable tube 11 in conjunction with the fixed tube 10 can also guide the fixing rod 9.

Preferably, a front surface of the box is provided with a second door panel, and the second door panel is located above the partition. A side surface of the box is provided with a first door panel, and the first door panel is located below the partition. When the second door panel 20 is opened, a photovoltaic panel may be placed inside the box 1, or the glass sheet and the silicon wafer obtained after the heating treatment may be taken out. When the first door panel 19 is opened, EVA and other impurities in an area below the partition 2 inside the box 1 may be cleaned.

Preferably, a lower end of the shelf board is fixedly connected with a mounting plate, and the mounting plate is connected to the partition through a screw. The shelf board 3 can be changed. For photovoltaic modules with different specifications, different shelf boards 3 may be used, thereby ensuring the normal proceeding of the subsequent operations.

Preferably, the suction cup is provided with a coupling, and an end of the first connecting tube is connected to the suction cup through the coupling. After the shelf board 3 is changed, the suction cup 4 is reconnected to the first connecting tube 5.

Preferably, the fixing rod is in an arc shape or an inverted V shape.

Preferably, a vertical distance from a lowest end of the groove to the partition is greater than a vertical distance from a highest end of the fixing rod to a lowest end of the splitting sheet. The distance between the groove 22 and the partition 2 is larger enough to ensure the fixing rod 9 to move to below the groove 22, so that the flexible magnetic meshes 14 can move to below the groove 22.

The disclosure has the following advantages:
1. The movable splitting sheets are arranged in the device. A lower end of the splitting sheet is provided with the gas vents, and hot air is discharged through the gas vents. The temperature of the hot air is controlled at 220-240° C. After being heated by the hot air, EVA expands and melts slowly. As the splitting sheet moves down, the EVA melts from top to bottom and flows down. The high-speed hot air sequentially blows the glass sheet and the silicon wafer to effectively blow the EVA away and avoid residues. In the whole process, there is no need of high-temperature heating, which saves the energy. Moreover, the EVA is basically not decomposed, which avoids the production of harmful gases. Thus, the device is environmentally friendly.
2. While the fixing rod is moving down, the hot air sprayed from the splitting sheet melts the EVA to expose the silicon wafer. The silicon wafer is clamped by the flexible magnetic meshes after passing through the first through slot. When the fixing rod moves to below the photovoltaic module, the lower ends of the flexible magnetic meshes contact each other, and the flexible magnetic meshes adhere to each other to completely support the silicon wafer, thereby preventing the silicon wafer from falling off and ensuring the completeness of the silicon wafer.

In the figures: 1 box, 2 partition, 3 shelf board, 4 suction cup, 5 first connecting tube, 6 negative pressure pump, 7 servo push rod, 8 fixed block, 9 fixing rod, 10 fixed tube, 11 movable tube, 12 splitting sheet, 13 rotary roller, 14 flexible magnetic mesh, 15 first through slot, 16 gas pump, 17 second connecting tube, 18 heating rod, 19 first door panel, 20 second door panel, 21 servo motor, 22 groove, 23 second through slot, 24 mounting plate, 25 coupling, 26 gas channel, and 27 gas vent.

DETAILED DESCRIPTION OF THE EMBODIMENTS

The technical solutions in the embodiments of the disclosure will be clearly and completely described below with reference to the accompanying drawings in the embodiments of the disclosure. It is apparent that the described embodiments are only a part of the embodiments, rather than all of the embodiments of the disclosure.

Figure 1:
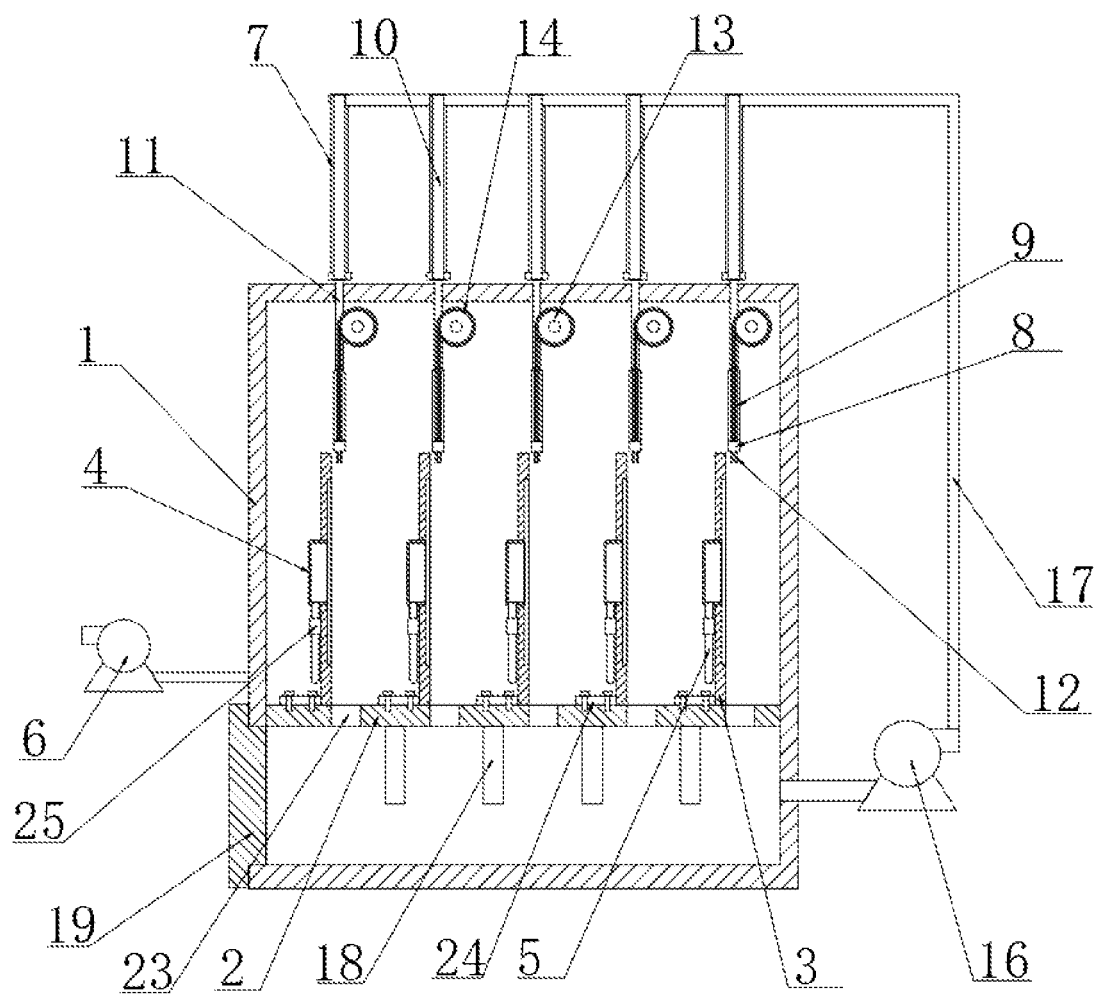
FIG. 1 is a schematic structural diagram of a front sectional view of a heating treatment device for photovoltaic module recycling according to the disclosure.
Figure 2:
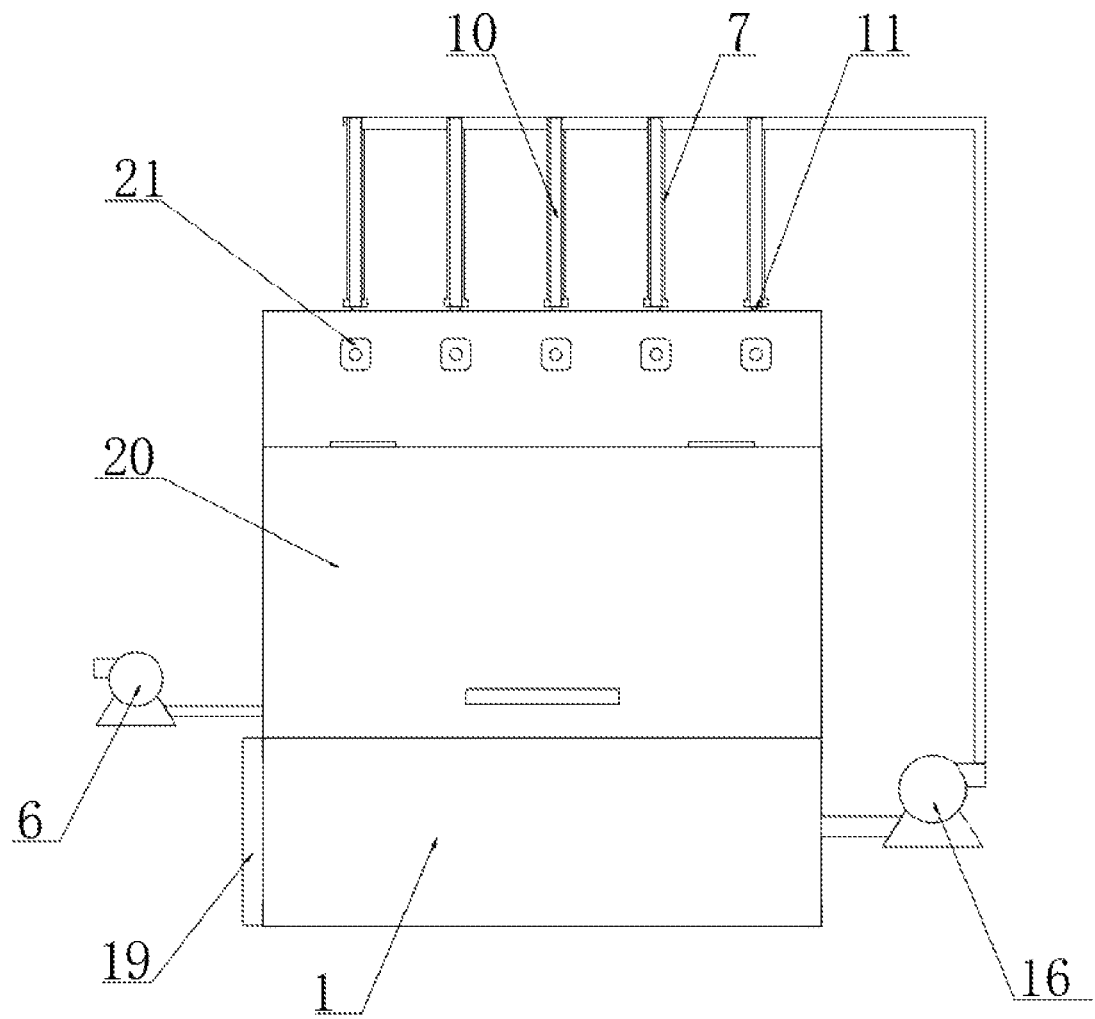
FIG. 2 is a schematic structural diagram of a front view of the heating treatment device for photovoltaic module recycling according to the disclosure.
Figure 3:
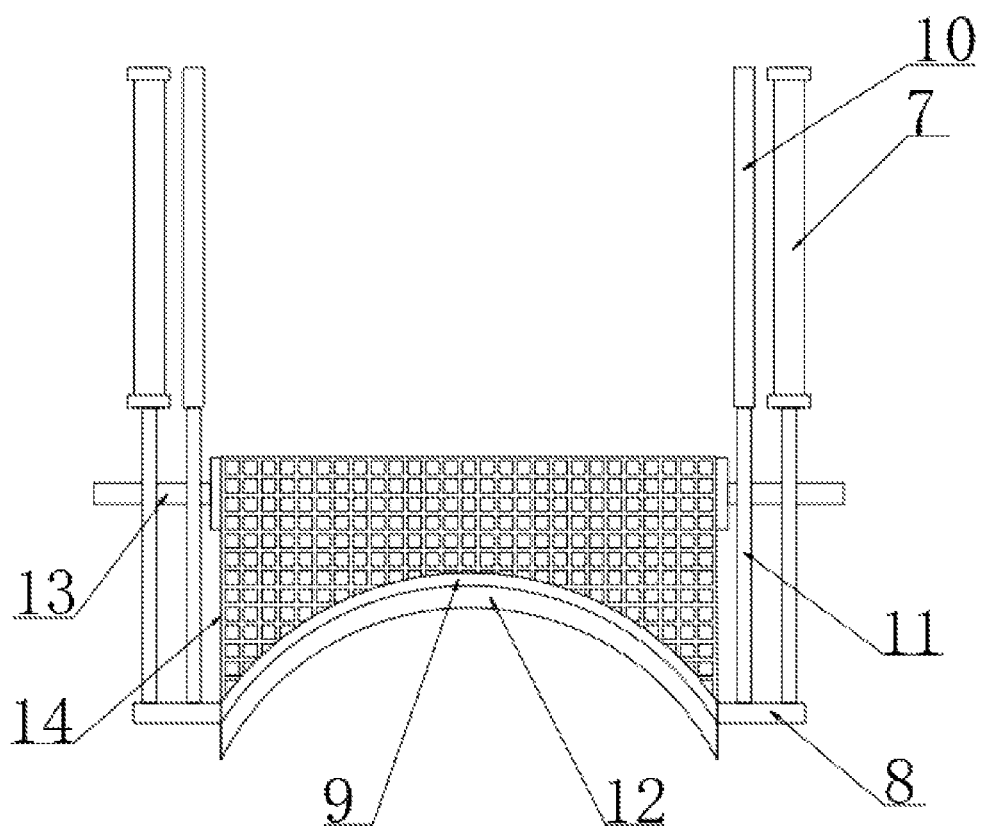
FIG. 3 is a schematic structural diagram of a front view of a silicon wafer separating mechanism and a flexible magnetic mesh of the heating treatment device for photovoltaic module recycling according to the disclosure.
Figure 4:
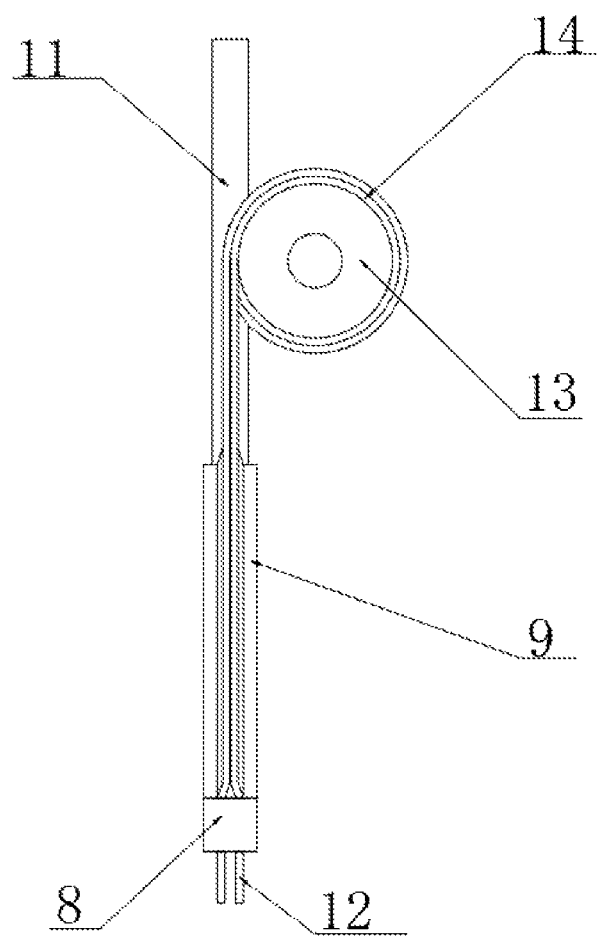
FIG. 4 is a schematic structural diagram of a side view of the silicon wafer separating mechanism and flexible magnetic mesh of the heating treatment device for photovoltaic module recycling according to the disclosure.
Figure 5:
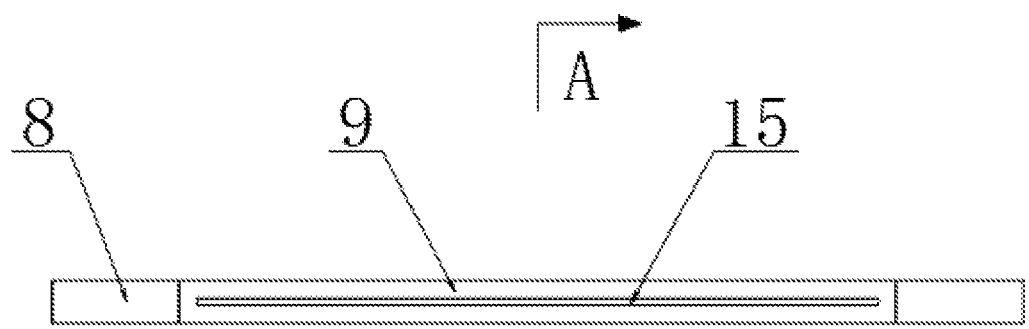
FIG. 5 is a schematic structural diagram of a top view of the silicon wafer separating mechanism of the heating treatment device for photovoltaic module recycling according to the disclosure.
Figure 5:
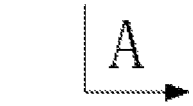
Figure 6:
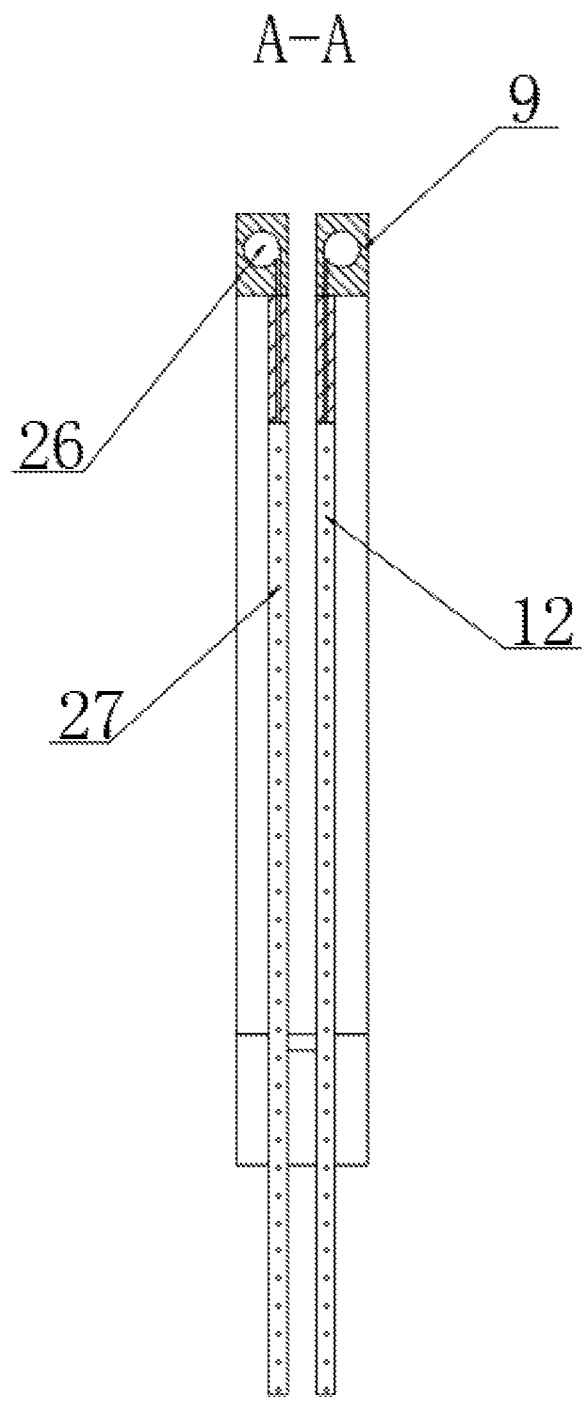
FIG. 6 is a schematic structural diagram of a sectional view of the heating treatment device for photovoltaic module recycling in FIG. 5 taken along line A-A according to the disclosure.
Figure 7:
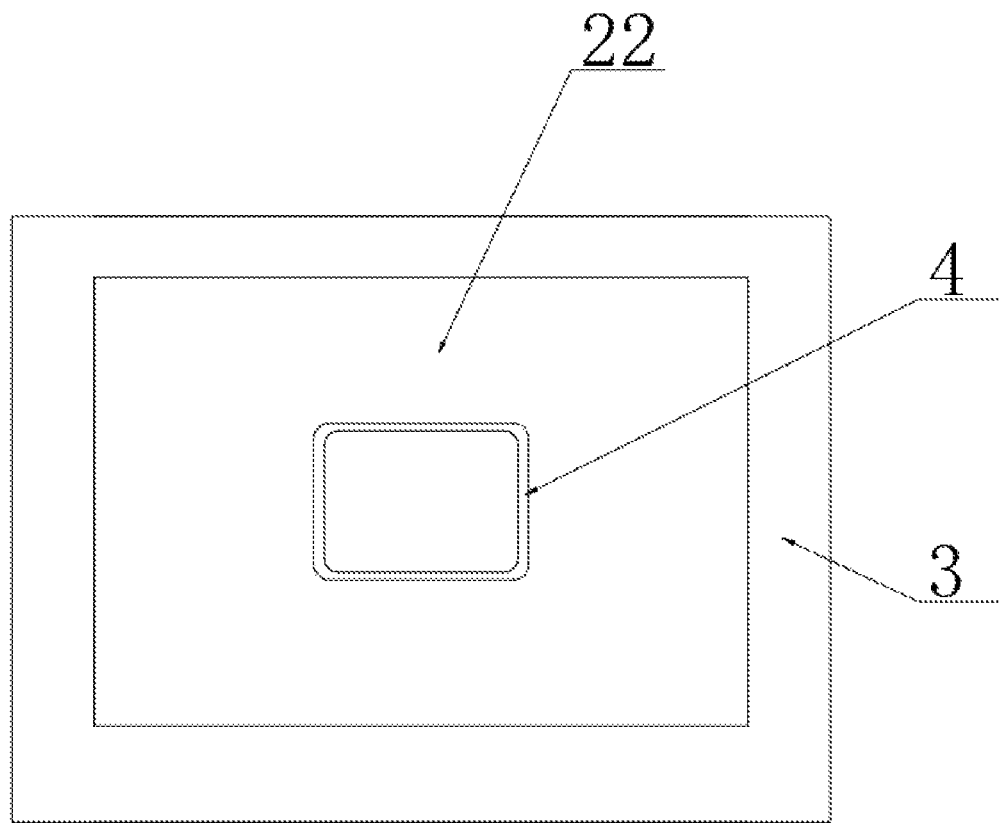
FIG. 7 is a schematic structural diagram of a side view of a shelf board of the heating treatment device for photovoltaic module recycling according to the disclosure.

Referring to FIGS. 1-7, a heating treatment device for photovoltaic module recycling includes a box 1, a heating rod 18 and a gas pump 16. A horizontal partition 2 is fixedly arranged inside the box 1, and the heating rod 18 is located below the partition 2. The partition 2 is provided with evenly distributed second through slots 23. An upper end of the partition 2 is provided with evenly distributed shelf boards 3. The shelf boards 3 are arranged vertically. One side of the shelf board 3 is provided with a groove 22. The shelf board 3 is further provided with a suction cup 4. An end surface at an opening of the suction cup 4 is flush with an inner wall of the groove 22. The suction cup 4 is connected to an inlet end of a negative pressure pump 6 through a first connecting tube 5. Silicon wafer separating mechanisms are further arranged inside the box 1. The silicon wafer separating mechanism is located right above the corresponding second through slot 23. The silicon wafer separating mechanism includes a fixing rod 9, and a height of two ends of the fixing rod 9 is less than that of a middle part of the fixing rod 9. The fixing rod 9 is in an arc shape or an inverted V shape. The middle part of the fixing rod 9 is provided with a first through slot 15 along a length direction thereof. A lower end of the fixing rod 9 is fixedly provided with two splitting sheets 12 corresponding to each other. The splitting sheets 12 are located on two sides of the first through slot 15. A gas channel 26 is arranged inside the fixing rod 9. The splitting sheet 12 is provided with evenly distributed gas vents 27. The gas vents 27 communicate with the gas channel 26. Openings of the gas vents 27 face downward. The gas channel 26 is connected to an outlet end of the gas pump 16 through a second connecting tube 17. An inlet end of the gas pump 16 is located below the partition 2 and communicates with the inside of the box 1. An upper end of the box 1 is further provided with a servo push rod 7 for driving the fixing rod 9 to make a vertical rectilinear motion.

An upper end of the fixing rod 9 is connected with two flexible magnetic meshes 14 corresponding to each other, and the flexible magnetic mesh 14 is wound outside a rotary roller 13. An end of the rotary roller 13 is rotatably connected to the box 1, and an outer wall of the box 1 is provided with a servo motor 21 for driving the rotary roller 13 to rotate. The servo motor 21 rotates to wind or unwind the flexible magnetic meshes 14.

The two ends of the fixing rod 9 are respectively fixedly provided with a fixed block 8, and a retractable end of the servo push rod 7 is fixedly connected to the fixed block 8. The upper end of the box 1 is fixedly provided with a fixed tube 10, and an upper end of the fixed tube 10 is provided with an end cap. The upper end of the fixed tube 10 communicates with the second connecting tube 17, and a movable tube 11 is inserted into a lower end of the fixed tube 10. An outer wall of the movable tube 11 is hermetically connected to an inner wall of the fixed tube 10. The inner wall of the fixed tube 10 may be provided with a sealing ring. A lower end of the movable tube 11 is fixedly connected to the fixed block 8, and the movable tube 11 communicates with the gas channel 26. When the servo push rod 7 pushes the fixing rod 9 to move, the movable tube 11 can move along the fixed tube 10, and gas in the fixed tube 10 can normally flow to the movable tube 11. The movable tube 11 in conjunction with the fixed tube 10 can also guide the fixing rod 9.

A front surface of the box 1 is provided with a second door panel 20, and the second door panel 20 is located above the partition 2. A side surface of the box 1 is provided with a first door panel 19, and the first door panel 19 is located below the partition 2. When the second door panel 20 is opened, a photovoltaic panel may be placed inside the box 1, or a glass sheet and the silicon wafer obtained after the heating treatment may be taken out. When the first door panel 19 is opened, EVA and other impurities in an area below the partition 2 inside the box 1 may be cleaned.

A lower end of the shelf board 3 is fixedly connected with a mounting plate 24, and the mounting plate 24 is connected to the partition 2 through a screw. The suction cup 4 is provided with a coupling, and an end of the first connecting tube 5 is connected to the suction cup 4 through the coupling. The shelf board 3 can be changed. For photovoltaic modules with different specifications, different shelf boards 3 may be used, thereby ensuring the normal proceeding of the subsequent operations. After the shelf board 3 is changed, the suction cup 4 is reconnected to the first connecting tube 5.

A vertical distance from a lowest end of the groove 22 to the partition 2 is greater than a vertical distance from a highest end of the fixing rod 9 to a lowest end of the splitting sheet 12. The distance between the groove 22 and the partition 2 is larger enough to ensure the fixing rod 9 to move to below the groove 22, so that the flexible magnetic meshes 14 can move to below the groove 22.

The movable splitting sheets 12 are arranged in the device. A lower end of the splitting sheet 12 is provided with the gas vents 27, and hot air is discharged through the gas vents 27. The temperature of the hot air is controlled at 220-240° C. After being heated by the hot air, EVA expands and melts slowly. As the splitting sheet 12 moves down, the EVA melts from top to bottom and flows down. In the whole process, there is no need of high-temperature heating, and the EVA is basically not decomposed, which avoids the production of harmful gases. Thus, the device is environmentally friendly.

While the fixing rod 9 is moving down, the hot air sprayed from the splitting sheet 12 melts the EVA to expose the silicon wafer. The silicon wafer is clamped by the flexible magnetic meshes 14 after passing through the first through slot 15. When the fixing rod 9 moves to below the photovoltaic module, the lower ends of the flexible magnetic meshes 14 contact each other, and the flexible magnetic meshes 14 adhere to each other to completely support the silicon wafer, thereby preventing the silicon wafer from falling off and ensuring the completeness of the silicon wafer.

When the device operates, the photovoltaic module (the photovoltaic module is the photovoltaic panel with the aluminum alloy frame removed, the same below) is arranged in the groove 22, the negative pressure pump 6 is started to suck the photovoltaic module such that the glass sheet of the photovoltaic module is tightly attached to the groove 22. The door panel is closed, and the heating rod 18 and the gas pump 16 are started to increase the temperature inside the box 1. When the temperature reaches a preset value, the servo push rod 7 drives the fixing rod 9 to move downward. The servo motor 21 is started to unwind the flexible magnetic meshes 14. The lower end of the splitting sheet 12 is provided with the gas vents 27, and hot air is discharged through the gas vents 27. The temperature of the hot air is controlled at 220-240° C. After being heated by the hot air, EVA expands and melts slowly. As the splitting sheet 12 moves down, the EVA melts from top to bottom and flows down. While the fixing rod 9 is moving down, the silicon wafer is clamped by the flexible magnetic meshes 14 after passing through the first through slot 15. When the fixing rod 9 moves to below the photovoltaic module, the lower ends of the flexible magnetic meshes 14 contact each other, and the flexible magnetic meshes 14 adhere to each other to completely support the silicon wafer, thereby preventing the silicon wafer from falling off. The height of the two ends of the fixing rod 9 is less than that of the middle part of the fixing rod 9. When the two ends of the fixing rod 9 move to below the photovoltaic module, the middle part of the fixing rod 9 is still above the photovoltaic module, that is, when the flexible magnetic meshes 14 pass through the two ends of the lower end of the photovoltaic module and clamp the silicon wafer, the middle part of the lower end of the silicon wafer is still bonded with the glass sheet. In this way, before the silicon wafer is completely separated from the glass sheet, the flexible magnetic meshes 14 can support the silicon wafer, thereby preventing the silicon wafer from falling off. After the device is shut down, the complete glass sheet and silicon wafer can be taken out.

The foregoing descriptions are merely preferred implementations of the disclosure, but the protection scope of the disclosure is not limited thereto. Any equivalent substitution or change made based on the technical solution and inventive concept of the disclosure by those skilled in the art within the technical scope disclosed in the disclosure shall fall within the protection scope of the disclosure.

What is claimed is:

1. A heating treatment device for photovoltaic module recycling, comprising a box, a heating rod and a gas pump,
    wherein a horizontal partition is fixedly arranged inside the box, the heating rod is located below the partition, the partition is provided with evenly distributed second through slots, and an upper end of the partition is provided with evenly distributed shelf boards, wherein
    the shelf boards are arranged vertically, one side of each of the shelf boards is provided with a groove, and each of the shelf boards is further provided with a suction cup, wherein
    an end surface at an opening of the suction cup is flush with an inner wall of the groove, and the suction cup is connected to an inlet end of a negative pressure pump through a first connecting tube,
    wherein silicon wafer separating mechanisms are further arranged inside the box, each of the silicon wafer separating mechanisms is located right above each of the second through slots, and each of the silicon wafer separating mechanisms comprises a fixing rod, wherein
    a height of two ends of the fixing rod is less than a height of a middle part of the fixing rod, the middle part of the fixing rod is provided with a first through slot along a length direction of the fixing rod, and a lower end of the fixing rod is fixedly provided with two splitting sheets corresponding to each other, wherein
    the two splitting sheets are located on two sides of the first through slot, a gas channel is arranged inside the fixing rod, and each of the two splitting sheets is provided with evenly distributed gas vents, wherein
    the gas vents communicate with the gas channel, openings of the gas vents face downward, and the gas channel is connected to an outlet end of the gas pump through a second connecting tube,
    wherein an inlet end of the gas pump is located below the partition and communicates with an inside of the box, and an upper end of the box is further provided with a servo push rod for driving the fixing rod to make a vertical rectilinear motion.

2. The heating treatment device according to claim 1, wherein an upper end of the fixing rod is connected with two flexible magnetic meshes corresponding to each other, each of the two flexible magnetic meshes is wound outside a rotary roller, an end of the rotary roller is rotatably connected to the box, and an outer wall of the box is provided with a servo motor for driving the rotary roller to rotate.

3. The heating treatment device according to claim 2, wherein the two ends of the fixing rod are respectively fixedly provided with a fixed block, and a retractable end of the servo push rod is fixedly connected to the fixed block.

4. The heating treatment device according to claim 3, wherein the upper end of the box is fixedly provided with a fixed tube,
    an upper end of the fixed tube is provided with an end cap, and the upper end of the fixed tube communicates with the second connecting tube,
    a movable tube is inserted into a lower end of the fixed tube, an outer wall of the movable tube is hermetically connected to an inner wall of the fixed tube, a lower end of the movable tube is fixedly connected to the fixed block, and the movable tube communicates with the gas channel.

5. The heating treatment device according to claim 1, wherein a front surface of the box is provided with a second door panel, the second door panel is located above the partition, a side surface of the box is provided with a first door panel, and the first door panel is located below the partition.

6. The heating treatment device according to claim 1, wherein a lower end of each of the shelf boards is fixedly connected with a mounting plate, and the mounting plate is connected to the partition through a screw.

7. The heating treatment device according to claim 6, wherein the suction cup is provided with a coupling, and an end of the first connecting tube is connected to the suction cup through the coupling.

8. The heating treatment device according to claim 1, wherein the fixing rod is in an arc shape or an inverted V shape.

9. The heating treatment device according to claim 1, wherein a vertical distance from a lowest end of the groove to the partition is greater than a vertical distance from a highest end of the fixing rod to a lowest end of each of the two splitting sheets.

10. The heating treatment device according to claim 2, wherein a vertical distance from a lowest end of the groove to the partition is greater than a vertical distance from a highest end of the fixing rod to a lowest end of each of the two splitting sheets.

11. The heating treatment device according to claim 3, wherein a vertical distance from a lowest end of the groove to the partition is greater than a vertical distance from a highest end of the fixing rod to a lowest end of each of the two splitting sheets.

12. The heating treatment device according to claim 4, wherein a vertical distance from a lowest end of the groove to the partition is greater than a vertical distance from a highest end of the fixing rod to a lowest end of each of the two splitting sheets.

13. The heating treatment device according to claim 5, wherein a vertical distance from a lowest end of the groove to the partition is greater than a vertical distance from a highest end of the fixing rod to a lowest end of each of the two splitting sheets.

14. The heating treatment device according to claim 6, wherein a vertical distance from a lowest end of the groove to the partition is greater than a vertical distance from a highest end of the fixing rod to a lowest end of each of the two splitting sheets.

15. The heating treatment device according to claim 7, wherein a vertical distance from a lowest end of the groove to the partition is greater than a vertical distance from a highest end of the fixing rod to a lowest end of each of the two splitting sheets.

16. The heating treatment device according to claim 8, wherein a vertical distance from a lowest end of the groove to the partition is greater than a vertical distance from a highest end of the fixing rod to a lowest end of each of the two splitting sheets.

* * * * *